United States Patent
Schmid et al.

(10) Patent No.: US 7,283,577 B2
(45) Date of Patent: Oct. 16, 2007

(54) RADIATION-EMITTING SEMICONDUCTOR COMPONENT

(75) Inventors: Wolfgang Schmid, Deuerling/Hillohe (DE); Ralph Wirth, Pettendorf-Adlersberg (DE); Klaus Streubel, Laaber (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 149 days.

(21) Appl. No.: 11/291,692

(22) Filed: Nov. 30, 2005

(65) Prior Publication Data

US 2006/0222040 A1 Oct. 5, 2006

(30) Foreign Application Priority Data

Nov. 30, 2004 (DE) .................. 10 2004 057 802

(51) Int. Cl.
*H01S 3/08* (2006.01)
(52) U.S. Cl. ................ 372/99; 372/50.11; 372/50.124
(58) Field of Classification Search ................ 372/99, 372/50.11, 50.124
See application file for complete search history.

(56) References Cited

U.S. PATENT DOCUMENTS

| | | | |
|---|---|---|---|
| 5,226,053 A | | 7/1993 | Cho et al. |
| 5,677,924 A | | 10/1997 | Bestwick |
| 6,055,262 A | | 4/2000 | Cox et al. |
| 6,420,199 B1 * | | 7/2002 | Coman et al. ................ 438/22 |
| 2005/0047465 A1 | | 3/2005 | Gross |

FOREIGN PATENT DOCUMENTS

| | | |
|---|---|---|
| DE | 100 56 476 A1 | 5/2002 |
| EP | 0 712 181 A1 | 11/1995 |
| EP | 1 501 161 A1 | 7/2004 |
| WO | WO 02/065555 A1 | 8/2002 |

OTHER PUBLICATIONS

Ralph Wirth, et al., "High-Efficiency Resonant-Cavity LEDs Emitting at 650 nm", IEEE Photonics Technology Letters, vol. 13, No. 5, pp. 421-423, May 2001.
H. De Neve et al., "Resonant Cavity LED's" Microactivities and Photonic Bandgaps: Physics and Appl., pp. 324, 333-342, 1996.
H. Bensity et al., "Impact of Planar Microcavity Effects on Light Extraction—Part I: Basic Concepts and Analytical Trends", J. Quantum Electronics, vol. 34, No. 9, pp. 1612-1631, 1998.
H. Bensity et al., "Impact of Planar Microcavity Effects on Light Extraction—Part II: Selected Exact Simulations and Role of Photon Recycling", J. Quantum Electronics, vol. 34, No. 9, pp. 1632-1643, 1998.

* cited by examiner

*Primary Examiner*—Nguyen (Michael) Dung
(74) *Attorney, Agent, or Firm*—Cohen Pontani Lieberman & Pavane LLP

(57) ABSTRACT

A radiation-emitting semiconductor component, having a semiconductor layer sequence (1) with an active zone (2) provided for radiation generation and a first mirror arranged downstream of the active zone. The first mirror comprises a metal layer (4) and an intermediate layer (3) made of a radiation-transmissive and electrically conductive material, said intermediate layer being arranged on that side of the metal layer (4) which faces the active zone. The radiation-emitting semiconductor component is provided for operation with an optical resonator and for generating predominantly incoherent radiation as an RCLED or the radiation-emitting semiconductor component being provided for operation with an external optical resonator and for generating predominantly coherent radiation as a VECSEL.

23 Claims, 2 Drawing Sheets

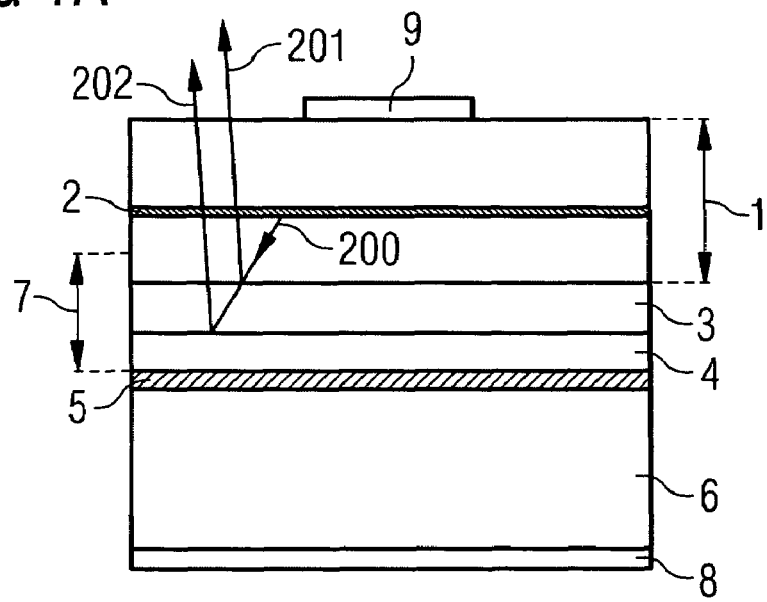
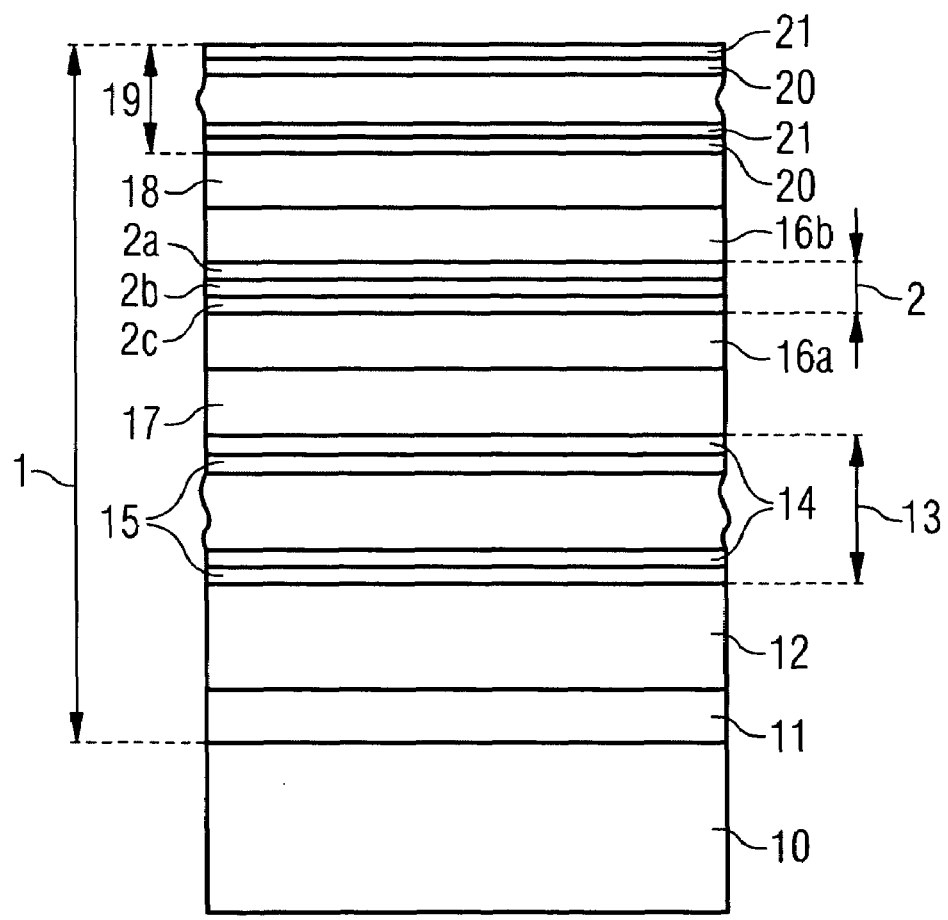

RADIATION-EMITTING SEMICONDUCTOR COMPONENT

RELATED APPLICATIONS

This patent application claims the priority of German patent application 10 2004 057 802.8, the disclosure content of which is hereby incorporated by reference.

FIELD OF THE INVENTION

The present invention relates to a radiation-emitting semiconductor component having a semiconductor layer sequence with an active zone intended for radiation generation, and a first mirror arranged downstream of the active zone.

BACKGROUND OF THE INVENTION

Radiation-emitting semiconductor components of this type may be realized, for example, as vertical emitting semiconductor components. In this case, the vertical emission direction generally runs essentially perpendicular to a lateral main direction of extent of the semiconductor layer sequence, in particular the surface thereof. In components of this type, the first mirror is often embodied as a Bragg mirror for the directional reflection of radiation generated in the active zone.

A Bragg mirror usually contains a plurality of semiconductor layer pairs having a respective layer thickness of approximately $\lambda/(4n)$, where $\lambda$ specifies the wavelength of the radiation generated in the active zone and n specifies the refractive index of the respective semiconductor layer.

The Bragg mirror is normally formed in highly reflective fashion, for instance with a reflectivity of 99% or more, which generally requires a comparatively high number of semiconductor layer pairs, for instance 30 or more, which consequently lead to a considerable thickness of the Bragg mirror and hence of the semiconductor component.

A component of this type may be embodied as a laser component with a vertical emission direction which is provided for generating coherent radiation by means of an internal resonator (VCSEL: Vertical Cavity Surface Emitting Laser) or an external resonator (VECSEL: Vertical External Cavity Surface Emitting Laser). In the case of a VCSEL, a second mirror for the internal resonator is generally monolithically integrated together with the first mirror in the semiconductor layer sequence. For a VECSEL, an external mirror for the optical resonator is arranged downstream of the semiconductor layer sequence.

Furthermore, the heat loss that arises in the active zone during operation of a semiconductor component of this type may have a disadvantageous effect on the function of the component. Good heat dissipation from the component is therefore desirable. However, the heat dissipation from the active zone is impeded by the numerous interfaces in a highly reflective Bragg mirror. This is the case particularly when the materials of the Bragg mirror have a relatively low thermal conductivity anyway and the heat dissipation is impaired more extensively by the multiplicity of interfaces.

In addition, making efficient electrical contact with the component through the Bragg mirror is made more difficult on account of its critical thickness.

SUMMARY OF THE INVENTION

It is an object of the present invention to provide an improved radiation-emitting semiconductor component of the type mentioned in the introduction which, in particular, can be formed small and compact and also with an increased efficiency.

This and other objects are attained in accordance with one aspect of the present invention directed to a radiation-emitting semiconductor component having a semiconductor layer sequence with an active zone intended for radiation generation and a first mirror arranged downstream of the active zone. The first mirror comprises a metal layer and an intermediate layer made of a radiation-transmissive and electrically conductive material, said intermediate layer being arranged on that side of the metal layer which faces the active zone. The radiation-emitting semiconductor component is adapted for operation with an optical resonator and for generating incoherent radiation as an RCLED or for operation with an external optical resonator and for generating coherent radiation as a VECSEL.

The intermediate layer can be arranged between semiconductor layer sequence and metal layer, particularly preferably with the metal layer being arranged on the intermediate layer and/or the intermediate layer being arranged on, in particular connected to, the semiconductor layer sequence.

It should be noted that a semiconductor component which is formed for generating predominantly incoherent and/or predominantly coherent radiation may also be regarded as being encompassed by the invention.

Such a first mirror having the metal layer and the intermediate layer has the advantage over a pure Bragg mirror of improved heat dissipation from the radiation-emitting semiconductor component. A Bragg mirror having an identical reflectivity typically has more than 20 semiconductor layer pairs. Such a high number of semiconductor layers, however, may impede the dissipation of heat from the active zone owing to the multiplicity of interfaces and thus shorten the service life of the component.

In the case of the invention, the number of interfaces or semiconductor layer pairs can advantageously be kept small owing to the high reflectivity of the metal layer, as a result of which the heat dissipation can advantageously be improved. Furthermore, metals usually have a higher thermal conductivity than the materials of a Bragg mirror, as a result of which the heat dissipation is improved even further. This is particularly advantageous for the efficiency and the service life of components having a high power loss or evolution of heat, in particular a VECSEL.

A further advantage of the invention involves the small penetration depth of the radiation generated in the active zone into the metal layer. The penetration depth into a Bragg mirror having an identical reflectivity is significantly greater than the penetration depth into a metal layer, which is typically less than one quarter of the wavelength, owing to the high number of semiconductor layer pairs having the thickness $\lambda/(4n)$ which participate in the reflection. The penetration depth into the Bragg mirror is significantly determined by the thickness of the Bragg mirror. The penetration depth into the Bragg mirror generally initially increases with the number of semiconductor layer pairs of the Bragg mirror and can converge toward a value that is determined by a difference in the refractive indices of the materials used for the individual semiconductor layers of the semiconductor layer pairs. Consequently, as seen from the active zone, the Bragg mirror acts as a virtual mirror having an identical reflectivity and negligible extent which, compared with the position of a first layer of the Bragg mirror that is arranged adjacent to the active zone, is further away from the active zone by the penetration depth.

On account of the small penetration depth into the metal layer, it is possible, in the case of the invention, for the active zone advantageously to be positioned closer to a corresponding virtual first mirror than in the case of a pure Bragg mirror, as a result of which the efficiency of the radiation-emitting semiconductor component can be increased. This applies in particular to an RCLED (Resonant Cavity Light Emitting Diode), the efficiency of which is critically influenced by the arrangement or the distance of the active zone with respect to the virtual first mirror. An arrangement at a well-defined distance close to the first mirror is particularly advantageous for an RCLED. A formation of the first mirror having a metal layer increases the degrees of freedom of the choice of distance with respect to the virtual first mirror and thus contributes to increasing the efficiency of the component.

In contrast to lasers, the optical resonator of an RCLED does not serve for amplifying individual modes by means of stimulated emission, rather the spontaneously emitted radiation is primarily directed in an emission direction. Compared with a radiation that is coupled out from a conventional LED without a resonator, the radiation that is coupled out from the resonator of an RCLED may have an increased radiation power. An RCLED is generally embodied as a surface emitting component with a vertical emission direction.

It should be noted that a metallic layer may also be regarded as a metal layer in the context of the invention, which in particular also encompasses a layer containing an alloy. However, a layer composed of metal is particularly suitable.

The low directional dependence of the reflectivity of the metal layer in comparison with a pure Bragg mirror may also advantageously influence the efficiency of the radiation-emitting semiconductor component. The reflectivity of Bragg mirrors is usually greatest in the region around the normal to their surface and decreases to a relatively great extent with an increasing angle of incidence with respect to said normal. By contrast, the reflectivity of metal layers is approximately constant over a wide angular range, so that even radiation that is incident at a large angle is still highly reflected and can be coupled out from the component. In particular, even radiation that impinges on the metal layer at comparatively large angles can be reliably reflected by means of the metal layer. Even such radiation components with large angles of impingement can thus be directed in the emission direction to an increased extent in a simplified manner.

The semiconductor layer sequence, in particular the active zone, can contain at least one III-V semiconductor material, for instance a material from the material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$. III-V semiconductor materials are distinguished by advantageously high quantum efficiency and are particularly suitable for the generation of radiation from the ultraviolet (e.g. $In_xGa_yAl_{1-x-y}N$) through the visible (e.g. $In_xGa_yAl_{1-x-y}N$ or $In_xGa_yAl_{1-x-y}P$) up into the infrared spectral range (e.g. $In_xGa_yAl_{1-x-y}As$). Furthermore, the radiation generated in the active zone can have a wavelength in the visible, in particular red, spectral range. The material system $In_xGa_yAl_{1-x-y}P$ is particularly suitable for this spectral range.

In one embodiment of the invention, the active zone comprises a single or multiple heterostructure, in particular a double heterostructure, or a quantum well structure, in particular a multiple quantum well structure. An advantageously high internal quantum efficiency of the semiconductor component can be achieved by means of structures of this type.

In the context of the application, the designation quantum well structure encompasses any structure in which charge carriers experience a quantization of their energy states as a result of confinement. In particular, the designation quantum well structure does not comprise any specification about the dimensionality of the quantization. It thus encompasses, inter alia, quantum wells, quantum wires and quantum dots and any combination of these structures.

The metal layer of the first mirror is preferably electrically conductively connected to the semiconductor layer sequence via the intermediate layer. A metal layer of this type may be involved not only in the reflection of radiation generated in the active zone but at the same time in making the electrical contact with the radiation-emitting semiconductor component and in this case advantageously effects a homogeneous lateral energization of the active zone. The metal layer can contain Au, Ag, Al, Pt or an alloy with at least one of these materials. In this case, Au has a particularly high reflectivity in the red spectral range and Al or Ag also has a particularly high reflectivity in the green and blue spectral range.

Furthermore, the metal layer may be arranged on a heat sink, thereby improving the heat dissipation from the component or the active zone.

The intermediate layer can be formed in electrically conductive fashion and more extensively is electrically conductively connected to the semiconductor layer sequence. The material of the intermediate layer advantageously has a better adhesion on the semiconductor layer sequence than the material of the metal layer and has an advantageous effect on the electrical contact between the metal layer and the semiconductor layer sequence.

The intermediate layer can contain a radiation-transmissive conductive oxide (transparent conducting oxide: TCO for short), in particular a metal oxide, for example a zinc oxide, such as ZnO, a tin oxide, such as SnO, a titanium oxide, such as TiO, an indium oxide, such as InO, or an indium tin oxide, such as ITO. Materials of this type are distinguished by a high conductivity, in particular in the lateral direction, and high radiation transmissivity over a wide wavelength range. Moreover, Zn can act as a dopant, in particular an acceptor, with regard to III-V semiconductors and thus improve the electrical contact with respect to the semiconductor layer sequence, in particular a p-conducting semiconductor layer of the layer sequence that adjoins the intermediate layer. As a result of this it is possible, for instance by indiffusion of the dopant into the semiconductor layer sequence, to facilitate the formation of a barrier-free or ohmic electrical contact with respect to the semiconductor layer sequence. The same applies correspondingly to Sn as a donor with regard to an adjoining n-conducting layer of the semiconductor layer sequence. In order to increase its conductivity, the intermediate layer may be suitably doped, for example with Al in the case of a zinc oxide or Sb in the case of a tin oxide.

First mirrors of this type can already achieve high reflectivities of above 90% in conjunction with good electrical contact properties and an advantageously small thickness of the mirror.

In one embodiment, the intermediate layer is at least partly formed in such a way that a radiation component reflected at the metal layer and a radiation component reflected at that side of the intermediate layer which faces the semiconductor layer sequence are constructively superimposed.

This dimensioning of the intermediate layer increases the efficiency of the component since destructive interferences that can occur in the case of an arbitrarily dimensioned intermediate layer are avoided. This formation of the intermediate layer is all the more advantageous, the higher the difference in refractive index between the material of the intermediate layer and the adjoining material on the part of the semiconductor layer sequence, since the radiation component reflected at this side of the intermediate layer increases as the difference in refractive index increases.

The constructive superposition of the abovementioned radiation components may be achieved for example by forming the intermediate layer with a suitable thickness.

In one embodiment, the intermediate layer is for this purpose at least partly, preferably completely embodied such that its thickness D is defined as follows:

$$D = \frac{\lambda}{4n_z} + k \cdot \frac{\lambda}{2n_z} - 1, \quad (1)$$

where $\lambda$ is the wavelength of the radiation generated in the active zone in vacuum, $n_z$ is the refractive index of the intermediate layer, k is a natural number (k=0, 1, 2, ...) and 1 is a finite residual length other than zero.

The residual length 1 is preferably less than one quarter of the wavelength $\lambda'$, ($\lambda/n_z$), preferably less than one eighth of the wavelength $\lambda'$, where $\lambda'$ denotes the wavelength of the radiation generated in the active zone (2) in the intermediate layer (3).

In order to form a constructive interference, the thickness of the intermediate layer is at least partly chosen such that the radiations reflected at the metal layer and at that side of the intermediate layer which faces the semiconductor layer sequence have a phase difference of approximately zero or even-numbered multiples of $\pi$. In this case, it is necessary to take account of possible phase jumps as a result of reflection, such as, for instance, at the metal layer and at that side of the intermediate layer which faces the semiconductor layer sequence.

If the refractive index $n_z$ of the intermediate layer is less than that of the adjoining material on the part of the semiconductor layer sequence, the thickness D of the intermediate layer, for a constructive superposition of radiations that are incident perpendicularly on the intermediate layer, preferably at least approximately fulfills the relationship $$D = \frac{\lambda}{4\pi \cdot n_z} \cdot (2k\pi + \Phi) = \frac{\lambda}{2n_z} \cdot \left(k + \frac{\Phi}{2\pi}\right). \quad (2)$$

In this case, $\lambda$ is once again the wavelength of the radiation generated in the active zone in vacuum, k (k=0, 1, 2, ...) is a natural number, and $\phi$ is the phase jump as a result of reflection at the metal layer. The factor $\lambda/(4\pi \cdot n_z)$ corresponds to the phase contribution $2D \cdot (2\pi \cdot n_z)/\lambda$ which arises as a result of radiation reflected at the metal layer passing twice through the intermediate layer having the thickness D.

If the refractive index $n_z$ of the intermediate layer is greater than that of the adjoining material on the part of the semiconductor layer sequence, then owing to the additional phase jump of $\pi$ from the reflection at an optically denser medium the term $2k\pi$ is to be replaced by $(2k+1)\pi$, so that in this case the following preferably at least approximately holds true for the thickness D of the intermediate layer:

$$D = \frac{\lambda}{4\pi \cdot n_z} \cdot ((2k+1)\pi + \Phi) = \frac{\lambda}{2n_z} \cdot \left(k + \frac{1}{2} + \frac{\Phi}{2\pi}\right) \quad (2')$$

An ideal metal layer has an unlimited conductivity, so that a phase jump of $\pi$ results upon reflection of an electromagnetic wave. According to equation (2), the thickness $D_{id}$ of the intermediate layer for such an ideal metal layer is $$D_{id} = \frac{\lambda}{4n_z} + k \cdot \frac{\lambda}{2n_z}. \quad (3)$$

By contrast, a real metal has only finite conductivity and the phase jump as a result of reflection at the metal layer results for example from the Fresnel formulae using the complex refractive index of the real metal. The thickness of the intermediate layer $D_{re}$ on a real metal layer results according to (2) as $$D_{re} = \frac{\lambda}{2n_z} \cdot \left(k + \frac{\Phi_{re}}{2\pi}\right). \quad (4)$$

The thickness $D_{re}$ of the intermediate layer for a real metal layer preferably deviates by approximately $$d_M = D_{id} - D_{re} = \frac{\lambda}{2n_z} \cdot \frac{(\pi - \Phi_{re})}{2\pi} \quad (5)$$

from the thickness $D_{id}$ on an ideally conductive metal layer in order to achieve constructive interference.

Since the phase which radiation that is incident on a real metal layer experiences upon reflection is generally positive, $d_M$ is also usually positive.

The quantity $d_M$ may be regarded, in the context of the invention as penetration depth into the metal layer which determines or concomitantly determines the position of the corresponding virtual first mirror. For real metals this penetration depth is usually less than one quarter of the wavelength, often less than one eighth of the wavelength, of the radiation generated in the active zone in the intermediate layer.

Furthermore, the penetration depth $d_M$ and the residual length 1 deviate from one another preferably by 20 nm or less, particularly preferably by 10 nm or less. In particular, the residual length and the penetration depth may also deviate from one another by less than 5 nm or match one another.

The phase $\phi_{re}$ experienced by the radiation reflected at the real metal layer can accordingly be compensated for by means of a corresponding thickness of the intermediate layer in such a way that the radiation components reflected at the metal layer and at that side of the intermediate layer which faces the semiconductor layer sequence have a phase difference which is at least approximately equal to zero or integral multiples of $\pi$. The phase difference of zero becomes possible by virtue of the fact that the phase as a result of reflection at the metal layer and the phase caused by the passage of the radiation through the intermediate layer may have opposite signs. This applies in particular to positive phases $\phi$ and $\phi_{re}$ as a result of reflection at the metal layer.

In one advantageous development of the intermediate layer, the thickness D thereof is given by equation (1) where k=0 and the residual length l is determined according to one of the above conditions. The thickness D of the intermediate layer thus deviates from $\lambda/(4n_z)$ by the residual length l.

This has the advantage that the thickness of the intermediate layer can be controlled more easily during application, since, in the case where the intermediate layer has a small layer thickness, possible irregularities in the thickness can be detected and thus controlled more easily than in the case of layer thicknesses having larger k values and identical residual lengths l. Furthermore, the thickness of the first mirror is advantageously kept small as a result of this.

In the case of the invention, the optical resonator may be formed as an internal or external resonator.

The resonator can be formed by the first mirror and a second mirror, which is arranged on that side of the active zone which is remote from the first mirror. The reflectivity of the second mirror can be less than that of the first mirror, the second mirror can further form a coupling-out mirror of the radiation-emitting semiconductor component. An effective resonator length of the semiconductor component is determined by the distance between the first and the second virtual mirror. A small effective resonator length is advantageous particularly for an RCLED.

An internal resonator may be formed, for example, with a Bragg mirror as a second mirror, which can be formed as part of the semiconductor layer sequence and is integrated in the latter.

An external resonator may be formed, for example, with a dielectric mirror as a second mirror, which arranged in a manner spaced apart from the semiconductor layer sequence.

In the case of laser components, such as VCSELs or VECSELs, the reflectivity of the coupling-out mirror that is required for achieving laser activity is usually greater than 98%. Remaining resonator mirrors, not serving for the coupling-out, often require even higher reflectivities in order to ensure that a laser activity is attained.

In the case of an RCLED, preferably having an internal resonator, the reflectivity of the coupling-out mirror is usually lower than in the case of a laser since an RCLED is designed for a high coupling-out efficiency which would be reduced unnecessarily by a highly reflective coupling-out mirror, as is customary or required in the case of lasers. Typical reflectivities of the coupling-out mirror are 90% or less, preferably 80% or less, particularly preferably 70% or less. Even a reflectivity of 60% or less may prove to be suitable.

In a further embodiment of the invention, the first mirror comprises, in addition to the metal layer and the intermediate layer, a Bragg mirror arranged on that side of the intermediate layer which faces the active zone, preferably between the intermediate layer and the active zone. In particular, the Bragg mirror may be integrated in the semiconductor layer sequence.

It is preferred for said Bragg mirror to contain fewer than 20, in this case preferably fewer than 6 and particularly preferably fewer than 4, semiconductor layer pairs. Such an additional Bragg mirror advantageously increases the reflectivity of the first mirror.

By means of the combination of metal layer, intermediate layer and additional Bragg mirror, it is possible to form a first mirror which compared with a Bragg mirror having an identical reflectivity and being formed solely by semiconductor layer pairs, contains a significantly smaller number of semiconductor layer pairs and has a smaller thickness. Such a thin, highly reflective mirror is particularly advantageous for a directional emission in an efficient (RC)LED. In the case of VCSEL or VECSEL, by way of example, a pure Bragg mirror usually necessitates more than 20 semiconductor layer pairs in order to achieve an often required reflectivity of more than 98%.

In the context of the invention, the number of semiconductor layer pairs can be kept smaller by comparison therewith. A reflectivity of 98%, for instance, can be achieved by means of an additional Bragg mirror with 3 semiconductor layer pairs in conjunction with the metal layer and the intermediate layer.

Such a first mirror is particularly advantageous if the materials available for a monolithically integratable Bragg mirror have only comparatively small differences in refractive index and, consequently, a correspondingly high number of semiconductor layer pairs of this difference in refractive index would be necessary for achieving a high reflectivity.

The penetration depth into the first mirror and the thickness of the first mirror can thus advantageously be reduced with the first mirror having high reflectivity. This may have a positive effect on the efficiency of the radiation-emitting semiconductor component, in particular an RCLED.

The comparatively small number of semiconductor layer pairs of an additional Bragg mirror furthermore leads not only to an advantageously improved heat dissipation, but also to shortened fabrication times, in particular epitaxy times, for the semiconductor layer sequence which may comprise the Bragg mirror of the first mirror.

The Bragg mirror or the Bragg mirrors can contain III-V semiconductor material suitable for the radiation generated in the active zone, particularly preferably $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

In one embodiment of the invention, the semiconductor layer sequence with the active zone is fabricated by epitaxial growth on a growth substrate. Afterward, firstly the intermediate layer and then the metal layer are applied, for example in each case by sputtering deposition or vapor deposition, onto that side of the semiconductor layer sequence which is remote from the growth substrate. The semiconductor layer sequence is subsequently connected to a suitable carrier on its side remote from the growth substrate. The connection can be formed in electrically conductive fashion and/or is effected by means of the metal layer. The metal layer may be bonded, for instance by means of eutectic bonding with suitable metal layers, soldered or adhesively bonded, for instance by means of an adhesive, preferably formed in electrically conductive fashion, onto the carrier. A connecting layer that is formed in the course of the connection is preferably arranged between the metal layer and the carrier. The growth substrate is subsequently stripped away and the composite comprising carrier, metal layer, intermediate layer and semiconductor layer sequence is singulated into components, each comprising a part of the semiconductor layer sequence (mesa), by means of a suitable separating method—for example dry-chemical mesa etching and subsequent sawing.

Such radiation-emitting semiconductor components which are fabricated by means of stripping away the growth substrate and fixing on a carrier are also referred to as thin-film components.

The carrier may furthermore be formed as an, in particular metal-containing, heat sink, thereby improving the dissipation of heat from the active zone.

In one embodiment of the invention, a contact structure for making electrical contact with the radiation-emitting semiconductor component, preferably in the form of a contact metallization, is arranged on that side of the active zone which is remote from the first mirror. An electrical insulation layer can be arranged below a region of the active zone, in particular on its side remote from the contact structure, which is overlapped by the contact structure, in particular in a component region arranged downstream of the contact structure in the vertical direction. The insulation layer can be arranged in a recess or cutout in the first mirror, which the latter may have in the region overlapped by the contact structure.

Such an insulation layer advantageously reduces the injection of current into the region of the active zone which is overlapped by the contact structure. As a result, in this region of the active zone a low radiation power is generated compared with the remaining regions. Consequently, the possibly absorbing contact structure can also only absorb radiation to a smaller extent, as a result of which the efficiency of the radiation-emitting semiconductor component is advantageously increased.

The insulation layer contains for example a silicon nitride, such as SiN, or other suitable materials.

Furthermore, a trench may be formed in that part of the semiconductor layer sequence which is arranged between the active zone and the first mirror, which trench preferably runs, in particular completely, around the contact structure projected into the plane of this part of the semiconductor layer sequence. Said trench can be at least partly, particularly preferably completely, filled with the material of the insulation layer. A region—which is enclosed by the trench—of that part of the semiconductor layer sequence which is arranged between the first mirror and the active zone is accordingly electrically isolated from the contact structure. Generation of radiation below the contact structure is thereby reduced. The trench may extend in the vertical direction from that side of the semiconductor layer sequence which is adjacent to the intermediate layer as far as the edge of the active zone or, if appropriate, right into the active zone.

BRIEF DESCRIPTION OF THE DRAWINGS

FIG. 1A shows a schematic sectional view of a first exemplary embodiment of a radiation-emitting semiconductor component according to the invention, FIG. 1B shows a schematic sectional view of an exemplary embodiment of a semiconductor layer sequence in a radiation-emitting semiconductor component according to the invention.

DETAILED DESCRIPTION OF THE DRAWINGS

Figure 2:
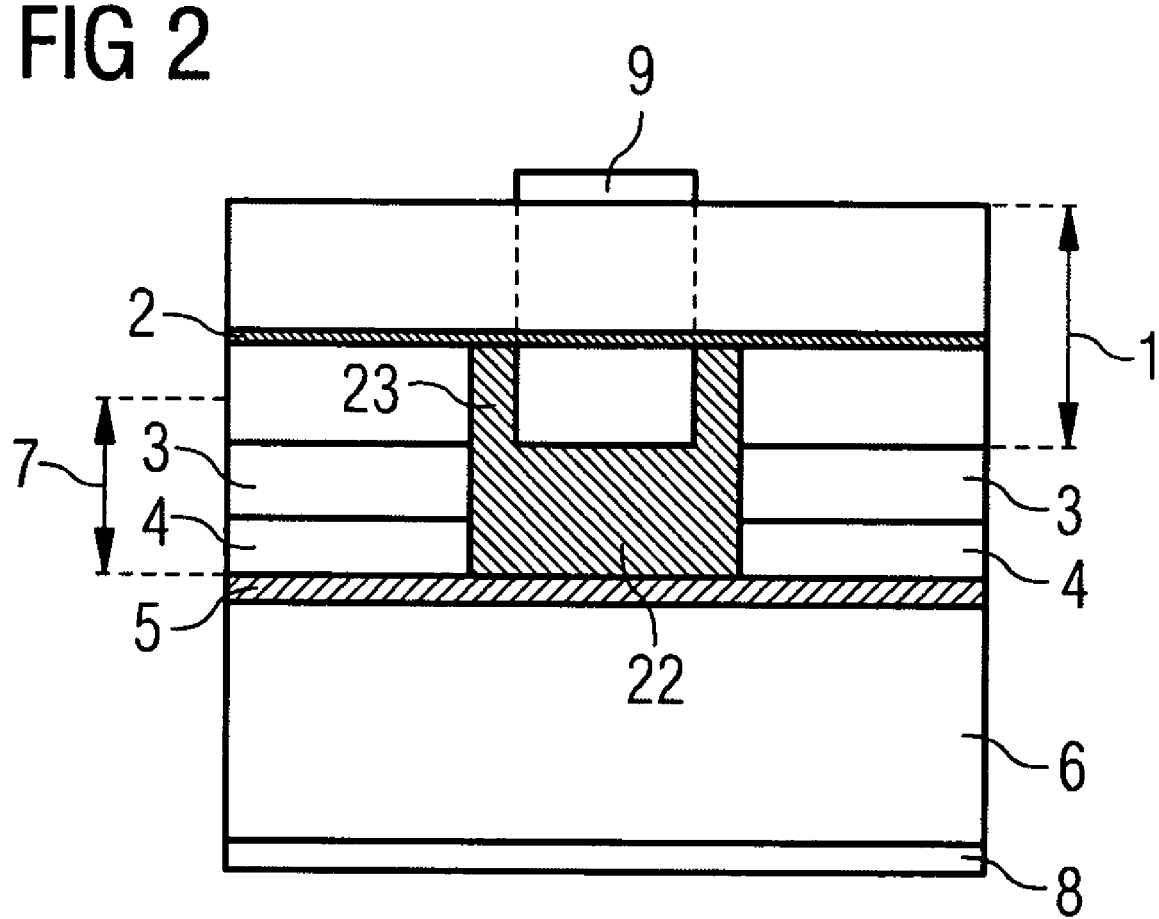
FIG. 2 shows a schematic sectional view of a second exemplary embodiment of a radiation-emitting semiconductor component according to the invention.

Elements that are identical, of identical type and act identically are provided with identical reference symbols in the figures.

FIG. 1A illustrates a schematic sectional view of a first exemplary embodiment of a radiation-emitting semiconductor component according to the invention.

Arranged downstream of a semiconductor layer sequence 1 with a radiation-generating active zone 2 is an electrically conductive and radiation-transmissive intermediate layer 3, and arranged downstream of the latter in turn is a metal layer 4. The metal layer 4 is connected to a carrier 6 via a connecting layer 5. The intermediate layer is preferably arranged between a semiconductor layer sequence and a metal layer.

The metal layer 4 and the intermediate layer 3 are part of a first mirror 7 of the radiation-emitting semiconductor component.

In this exemplary embodiment, electrical contact is made with the component via the electrodes 8 and 9. Since the electrode 8 is arranged on that side of the carrier 6 which is remote from the first mirror 7, said carrier is preferably doped in order to increase its conductivity or inherently has a correspondingly high conductivity. The semiconductor layer sequence 1 is electrically conductively connected to the electrode 8 via the metal layer 4, the electrically conductive and radiation-transmissive intermediate layer 3, the carrier 6 and the connecting layer 5.

Radiation 200 generated in the active zone 2 during operation of the component leaves the active zone in the direction of the first mirror 7. A first radiation component 201 is reflected at the interface between the intermediate layer 3 and the semiconductor layer sequence 1, and a further radiation component 202 is reflected at the metal layer 4. The intermediate layer is preferably formed in such a way that the radiation components 201 and 202 are constructively superposed. The reflection at the first mirror can thus be utilized particularly efficiently.

A thickness D or $D_{re}$ of the intermediate layer that is suitable for constructive superposition may be determined for this purpose in accordance with the conditions specified above, and the intermediate layer may be dimensioned accordingly.

A first mirror 7 of this type can already achieve reflectivities of above 90%, in particular in the visible spectral range.

If higher reflectivities of the first mirror are required, a Bragg mirror may be integrated in the semiconductor layer sequence 1 on the side of the intermediate layer 3 in order to increase the reflectivity of the first mirror 7. This is indicated in FIG. 1A by showing the first mirror 7 as extending into the semiconductor layer sequence. In this case, fewer semiconductor layer pairs are required in such a first mirror than in the case of a first mirror having an identical reflectivity which is formed exclusively as a Bragg mirror. By virtue of the smaller number of interfaces and the generally higher thermal conductivity of the metal layer compared with the semiconductor material of the Bragg mirror, the heat dissipation from the component is improved. In this case, the carrier 5 is preferably formed as a heat sink.

Depending on the embodiment of the semiconductor layer sequence 1 and/or of the resonator, a component of this type may be realized as a component that emits coherent laser radiation in the form of a VECSEL or as a component that emits incoherent radiation from spontaneous emission in the form of an RCLED, for instance with an internal resonator (not illustrated, cf. FIG. 1B). Furthermore, the invention is also suitable for further semiconductor components, for instance a laser, such as a VCSEL with an internal resonator, or an LED without a resonator.

An optical resonator of the component may be formed as an internal resonator, in particular for an RCLED, or as an external resonator, in particular for a VECSEL, with the first and a second mirror. For a laser component, in particular a VECSEL, the electrode 8, in a departure from the illustration, is preferably embodied as a ring electrode at the edge of the semiconductor layer sequence with a central region of the semiconductor layer sequence that is free from the electrode.

FIG. 1B illustrates a schematic sectional view of an exemplary embodiment of a semiconductor layer sequence 1 of a radiation-emitting semiconductor component according to the invention such as may be formed in FIG. 1A.

A semiconductor layer sequence 1 for an RCLED is illustrated in this example.

The semiconductor layer sequence 1, the active zone 2 of which is based for example on the III-V semiconductor material system $In_xGa_yAl_{1-x-y}P$, where $0 \leq x \leq 1$, $0 \leq y \leq 1$ and $x+y \leq 1$, is preferably grown epitaxially on a growth substrate 10, for instance GaAs. An etching stop layer 11, preferably made of $In_{0.5}Al_{0.25}Ga_{0.25}P$, is arranged on the growth substrate 10 and prevents disadvantageous effects of the action of an etchant on the subsequent layers. The current expansion layer 12, for example made of n-conducting $Al_{0.8}Ga_{0.2}As$, which is grown on this layer and typically has a thickness of 1-10 μm, is followed by a Bragg mirror 13 having for example 4 to 10 semiconductor layer pairs each comprising a layer 14 having a high refractive index, preferably made of n-conducting $Al_{0.5}Ga_{0.5}As$ and a layer 15 having a lower refractive index, for example made of n-conducting $Al_{0.95}Ga_{0.05}As$. The layer 14 of the respective pair that has a higher refractive index than the other layer of the same pair is preferably arranged on the part of the active zone 2 of this layer pair. In this case, the layer thickness of the respective layers of the Bragg mirror 13 is given by approximately one quarter of the wavelength of the radiation generated in this layer.

Active zone 2 comprises a layer sequence 2a, 2b, 2c, for example in the order $In_{0.6}Ga_{0.4}P$, $In_{0.5}Ga_{0.25}Al_{0.25}P$ and in turn $In_{0.6}Ga_{0.4}P$, having the respective thickness of approximately 5 nm, and is embodied for example as a double heterostructure or quantum film packet. Arranged around active zone 2 are an n-conducting waveguide layer 16a and a p-conducting waveguide layer 16b, preferably in each case made of $In_{0.5}Ga_{0.25}Al_{0.25}P$. Layer 16a is connected to the Bragg mirror 13 via an n-conducting barrier layer 17, for instance made of n-$In_{0.5}Al_{0.5}P$. The waveguide layer 16b is connected to the p-conducting side of the semiconductor layer sequence 1 via a p-conducting barrier layer 18, for example made of p-$In_{0.5}Al_{0.5}P$. Arranged downstream thereof is a p-conducting Bragg mirror 19, which is embodied in accordance with the Bragg mirror 13 and comprises for example 4 or fewer semiconductor layer pairs, in particular one pair to 4 pairs, having a layer 20 having a low refractive index, for example made of p-conducting $Al_{0.95}Ga_{0.5}As$, and a layer 21 having a higher refractive index, such as, for instance, made of p-conducting $Al_{0.5}Ga_{0.5}As$.

The barrier layers 17 and 18 serve for confinement of charge carriers in the active zone, which results in an increased charge carrier recombination in the active zone and, consequently, an increased efficiency of the component.

After the semiconductor layer sequence shown in FIG. 1B has been grown epitaxially on the growth substrate 10, a radiation-transmissive and electrically conductive intermediate layer 3, as shown in FIG. 1A, for example made of ZnO, preferably doped with Al, may be applied on the p side. This may be effected, in the same way as the subsequent application of the metal layer 4, for instance an Au layer, for example by sputtering or vapor deposition.

Such an intermediate layer 3 advantageously improves the adhesion of the Au layer on the semiconductor layer sequence by means of an increased adhesion relative to Au on the adjoining III-V semiconductor material. Furthermore, the intermediate layer advantageously improves the electrical contact between the Au layer and the semiconductor layer sequence, preferably through diffusion of Zn atoms, which may act as acceptors, into the adjoining III-V semiconductor. This ensures a homogeneous low-loss energization of the active zone 2 from the p-side since both the metal layer 4 and the intermediate layer 3 have a high conductivity, particularly in the lateral direction. A p-conducting AlGaAs-containing semiconductor layer is particularly suitable for forming an ohmic contact with the semiconductor layer sequence by means of a ZnO-containing intermediate layer adjoining the semiconductor layer.

On the n side of the semiconductor layer sequence, a homogeneous current distribution is achieved through the current expansion layer 12 in the semiconductor layer sequence 1. Compared with a component with two—one on the n side and one on the p-side—current expansion layers formed in the semiconductor layer sequence 1, it is possible to shorten the epitaxy time in this case.

Afterward, the metal layer may be connected via a connecting layer 5, for example a solder or bonding layer, to the carrier 6, which preferably contains GaAs and/or is formed as a heat sink. If the semiconductor layer sequence is fixed on the carrier by means of eutectic bonding with suitable metal layers, the connecting layer may, if appropriate, comprise a multilayer system. The growth substrate 10 is then stripped away, for example by etching, mechanical loading or a laser stripping method, and the electrodes 8, 9, for example in the form of contact metallizations, are arranged on the semiconductor layer sequence and that side of the carrier which is remote from the latter.

The metal layer 4, the intermediate layer 3 and the p-side Bragg mirror 19 form the first mirror 7 of the RCLED, which, together with the n-side Bragg mirror 13, constitutes the internal optical resonator of the component.

Owing to the highly absorbing structure with the metal layer 4 and the GaAs carrier 6, the second mirror 13 arranged on that side of the active zone which is remote from the carrier is expediently formed as a coupling-out mirror.

The emission wavelength λ of an RCLED of this type lies in the visible, for example in the red, spectral range, for instance at approximately 650 nm.

The thickness of the intermediate layer is approximately 70 nm for this wavelength. The thickness of the intermediate layer is thus reduced by the penetration depth $d_M \approx 30$ nm with respect to the thickness $D_{id} = \lambda/(4n_z) \approx 100$ nm of the intermediate layer for an ideal metal layer, the refractive index $n_z$ of the intermediate layer at the above wavelength for ZnO being approximately 1.6. In this case, the penetration depth $d_M$ results according to equation (5) with the phase $\phi_{re} \approx 2.2$ as a result of the reflection at the Au layer, which is calculated from the Fresnel formulae with the refractive index of Au being of complex number type and having a high imaginary part.

What is thereby advantageously achieved is that a maximum proportion of the radiation components reflected at that side of the intermediate layer 3 which faces the active zone 2 and at the metal layer 4 interferes constructively and the reflectivity of the first mirror 7 is not reduced by destructive interference.

The Bragg mirror 13 advantageously has a reflectivity of 90% or less, in order, in particular, not to reduce the coupling-out efficiency of the spontaneously emitted radiation, which, in the case of RCLEDs, is also influenced inter alia by the reflectivity of the coupling-out mirror.

In the case of such a configuration of the semiconductor layer sequence 1, the first mirror 7, by contrast, has a higher reflectivity of approximately 98% and an advantageously small penetration depth, so that the thickness is reduced compared with a pure Bragg mirror having an identical reflectivity, which, for $\lambda=650$ nm, would have to comprise approximately 23 of the abovementioned semiconductor layer pairs. The active zone 2 can thus be arranged close to the virtual first mirror, thereby advantageously increasing the efficiency of the RCLED.

Furthermore, the active zone 2 is arranged in the resonator preferably such that, during operation of the component, it is situated in an antinode of a standing wave that is formed in the resonator. The efficiency of the radiation-emitting component can thus be increased further through coupling to the maximum electric field strength of the standing wave. In particular, when positioning the active zone 2, it is necessary to take account of the heat arising during operation of the component and the resultant expansion of the individual constituent parts of the component, in particular in the semiconductor layer sequence, so that the active zone is arranged in an antinode during operation of the component.

A further advantage of a first mirror 7 of this type resides in the low directional dependence of the reflectivity at the metal layer 4, which is virtually independent of the angle of incidence of the radiation relative to the normal to the surface of the mirror. By contrast, radiation that leaves the active zone at a large angle with respect to the normal to the surface cannot be reflected, or can only be poorly reflected, by a pure Bragg mirror and can thus also only be coupled out from the component to a small extent.

At the metal layer 4, however, even radiation that is incident at a large angle is reflected to a large extent. This radiation can subsequently be absorbed by the active zone 2 and possibly be reemitted such that it is coupled out from the component (so-called photon recycling). In this way, particularly in the case of an active zone 2 with high quantum efficiency as can be realized in the case of InGaP-based components, the probability of a photon being coupled out once it has been generated is increased. In particular, this also applies to photons which would otherwise be subject to a continued total reflection in the resonator, which also occurs at comparatively large angles—greater than the critical angle of total internal reflection. The efficiency of the RCLED is thus improved more extensively.

It should be noted that the semiconductor layer sequence, with slight structural changes, can also be formed for a VECSEL, a VCSEL or an LED having a first mirror without a resonator.

FIG. 2 shows a schematic sectional view of a second exemplary embodiment of a radiation-emitting semiconductor component according to the invention.

This embodiment differs from the exemplary embodiment shown in FIG. 1A essentially by virtue of an insulation layer 22 arranged in a cutout in the intermediate layer 3 and the metal layer 4. The semiconductor layer sequence 1 may likewise be embodied as in FIG. 1B.

This electrical insulation layer 22, for example made of SiN, is arranged below the region of the active zone 2 which is overlapped or shaded by the electrode 9, which contains an absorbing metal, for example, and advantageously reduces the current component that flows from the electrode 8 into said region of the active zone 2. The region of the semiconductor layer sequence which is overlapped by the electrode 9 is illustrated by broken lines in FIG. 2. The insulation layer can be applied by means of sputtering or vapor deposition.

On account of the insulation layer, in this region only a low radiation power is generated compared with the remaining region of the active zone 2. The radiation component which can be absorbed by the electrode 9 is thus advantageously reduced and the efficiency of the component is increased further overall compared with that shown in FIG. 1A.

In this case, the cutout need not necessarily reach through the metal layer 4 and the intermediate layer 3 as far as the carrier 6. All that is essential is that a smallest possible current passes into that region of the active zone 2 which is covered by the electrode 9. A cutout in the intermediate layer or the metal layer alone may already suffice for this purpose.

It is preferred for at least one trench 23, preferably running around the electrode, to be formed in the semiconductor layer sequence, which trench further reduces generation of radiation in the active zone 2, which may be effected by a current flow around the insulation layer 22, below the electrode 9. The trench 23 is expediently filled with the material of the insulation layer. A trench of this type may be patterned intermediate layer, by means of an etching method. In FIG. 2, the trench extends in the vertical direction between the active zone and that side of the semiconductor layer sequence which faces the intermediate layer, preferably from the intermediate layer as far as the edge of the active zone, in order to reduce the risk of damage to the active zone on account of the patterning of the trench. The region of the semiconductor layer sequence which is enclosed by the trench is particularly preferably electrically isolated from the remaining region by means of the insulation material.

Overall, by means of the first mirror it is possible to realize an RCLED which has an external efficiency of 30% or more, preferably up to 40%.

It should be noted that the invention is also suitable for an efficient VCSEL with an internal resonator or an efficient LED without a resonator with a first mirror. A particularly high increase in efficiency can be achieved, however, in the case of an RCLED or a VECSEL.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. A radiation-emitting semiconductor component, comprising:
    a semiconductor layer sequence (1) having an active zone (2) adapted for radiation generation; and
    a first mirror arranged downstream of the active zone;
    wherein said first mirror comprises a metal layer (4) and an intermediate layer (3) made of a radiation-transmissive and electrically conductive material, said intermediate layer being arranged on that side of the metal layer (4) which faces the active zone; and
    wherein the radiation-emitting semiconductor component is adapted for operation with an optical resonator and for generating incoherent radiation as an RCLED or for operation with an external optical resonator and for generating coherent radiation as a VECSEL.

2. The radiation-emitting semiconductor component as claimed in claim 1, wherein
the intermediate layer (3) is at least partly formed in such a way that a radiation component reflected at the metal layer (4) and a radiation component reflected at that side of the intermediate layer (3) which faces the semiconductor layer sequence (1) are constructively superimposed.

3. The radiation-emitting semiconductor component as claimed in claim 1, wherein
the intermediate layer (3) has a thickness D which satisfies the relationship $$D = \frac{\lambda}{4n_z} + k \cdot \frac{\lambda}{2n_z} - 1,$$

where $\lambda$ denotes the vacuum wavelength of the radiation generated in the active zone (2), $n_z$ denotes the refractive index of the intermediate layer (3), k denotes a natural number including zero and 1 denotes a finite residual length other than zero.

4. The radiation-emitting semiconductor component as claimed in claim 3, wherein
the residual length 1 is less than one quarter of the wavelength $\lambda'$, ($\lambda/n_z$), preferably less than one eighth of the wavelength $\lambda'$, where $\lambda'$ denotes the wavelength of the radiation generated in the active zone (2) in the intermediate layer (3).

5. The radiation-emitting semiconductor component as claimed in claim 1, wherein
the intermediate layer contains an oxide, in particular a metal oxide.

6. The radiation-emitting semiconductor component as claimed in claim 1, wherein
the first mirror (7) comprises a Bragg mirror (19).

7. The radiation-emitting semiconductor component as claimed in claim 1, wherein
the metal layer (4) contains Au and the intermediate layer (3) contains ZnO.

8. The radiation-emitting semiconductor component as claimed in claim 6, wherein
the Bragg mirror (19) is arranged on that side of the intermediate layer (3) which faces the active zone (2).

9. The radiation-emitting semiconductor component as claimed in claim 6, wherein
the Bragg mirror (19) has not more than 20, semiconductor layer pairs.

10. The radiation-emitting semiconductor component as claimed in claim 1, wherein
the resonator has the first mirror (7) and a second mirror (13), the second mirror being arranged on the side of the active zone (2) which is opposite to the first mirror.

11. The radiation-emitting semiconductor component as claimed in claim 1, wherein
the semiconductor component is embodied as an RCLED and the optical resonator is an internal resonator.

12. The radiation-emitting semiconductor component as claimed in claim 10, wherein
the reflectivity of the first mirror (7) is greater than the reflectivity of the second mirror (13).

13. The radiation-emitting semiconductor component as claimed in claim 10, wherein
the radiation is coupled out from the semiconductor component through the second mirror.

14. The radiation-emitting semiconductor component as claimed in claim 10, wherein
the second mirror is embodied as a Bragg mirror.

15. The radiation-emitting semiconductor component as claimed in claim 6, wherein
the Bragg mirror or the Bragg mirrors contains or contain a III-V semiconductor material, preferably $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

16. The radiation-emitting semiconductor component as claimed in claim 1, wherein
a wavelength of the radiation generated in the active zone lies in the visible, in particular red, spectral range.

17. The radiation-emitting semiconductor component as claimed in claim 1, wherein
the semiconductor layer sequence (1) is arranged on a carrier (6).

18. The radiation-emitting semiconductor component as claimed in claim 17, wherein
the carrier (6) is different from a growth substrate (10) of the semiconductor layer sequence (1).

19. The radiation-emitting semiconductor component as claimed in claim 17, wherein
the carrier (6) comprises a heat sink.

20. The radiation-emitting semiconductor component as claimed in claim 1, wherein
a contact structure (8, 9) for making electrical contact with the semiconductor component is arranged on that side of the active zone which is remote from the first mirror.

21. The radiation-emitting semiconductor component as claimed in claim 20, wherein
an electrical insulation material is arranged below the region of the active zone which is overlapped by the contact structure (8, 9).

22. The radiation-emitting semiconductor component as claimed in claim 1, wherein
the radiation-emitting semiconductor component is a thin-film component.

23. The radiation-emitting semiconductor component as claimed, in claim 1, wherein
the semiconductor layer sequence (1), in particular the active zone, contains at least one III-V semiconductor material, preferably a material from the material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

* * * * *